United States Patent
Brandes et al.

(10) Patent No.: US 7,682,944 B2
(45) Date of Patent: Mar. 23, 2010

(54) PENDEO EPITAXIAL STRUCTURES AND DEVICES

(75) Inventors: George R. Brandes, Raleigh, NC (US); Arpan Chakraborty, Goleta, CA (US); Shuji Nakamura, Santa Barbara, CA (US); Monica Hansen, Santa Barbara, CA (US); Steven Denbaars, Goleta, CA (US)

(73) Assignee: Cree, Inc., Durham, NC (US)

( * ) Notice: Subject to any disclaimer, the term of this patent is extended or adjusted under 35 U.S.C. 154(b) by 107 days.

(21) Appl. No.: 11/957,154

(22) Filed: Dec. 14, 2007

(65) Prior Publication Data

US 2009/0152565 A1 Jun. 18, 2009

(51) Int. Cl.
*H01L 21/20* (2006.01)

(52) U.S. Cl. .............................. 438/478; 257/E21.097; 257/E21.126; 257/E21.127

(58) Field of Classification Search ................. 438/478; 257/E21.097, E21.126, E21.127
See application file for complete search history.

(56) References Cited

U.S. PATENT DOCUMENTS

| | | | |
|---|---|---|---|
| 6,051,849 A | 4/2000 | Davis et al. | |
| 6,265,289 B1 | 7/2001 | Zheleva et al. | |
| 6,403,451 B1 * | 6/2002 | Linthicum et al. | 438/479 |
| 6,500,257 B1 * | 12/2002 | Wang et al. | 117/95 |
| 6,582,986 B2 * | 6/2003 | Kong et al. | 438/48 |
| 6,599,362 B2 * | 7/2003 | Ashby et al. | 117/94 |
| 6,608,327 B1 | 8/2003 | Davis et al. | |
| 6,720,586 B1 * | 4/2004 | Kidoguchi et al. | 257/103 |
| 6,764,932 B2 | 7/2004 | Kong et al. | |
| 6,809,351 B2 * | 10/2004 | Kuramoto et al. | 257/190 |
| 6,940,098 B1 * | 9/2005 | Tadatomo et al. | 257/87 |
| 7,001,804 B2 * | 2/2006 | Dietz et al. | 438/164 |
| 7,052,979 B2 * | 5/2006 | Nagai et al. | 438/478 |
| 7,445,673 B2 * | 11/2008 | Beaumont et al. | 117/94 |
| 2005/0093099 A1 * | 5/2005 | Koike et al. | 257/615 |
| 2008/0054293 A1 * | 3/2008 | Lai et al. | 257/103 |

OTHER PUBLICATIONS

Zheleva et al., "Pendeo-Epitaxy—A New Approach for Lateral Growth of Gallium Nitride Structures", 1999, MRS Internet J. Nitride Semicond. Res. 4S1, G3.38, 6 pages.*
Roskowski et al., "Investigations Regarding the Maskless Pendeo-Epitaxial Growth of GaN Films Prior to Coalescence", Aug. 2002, IEEE Journal of Quantum Electronics, vol. 38, No. 8, pp. 1006-1016.*

* cited by examiner

*Primary Examiner*—Evan Pert
(74) *Attorney, Agent, or Firm*—Steven J. Hultquist; Richard T. Matthews; Intellectual Property/Technology Law

(57) ABSTRACT

A substrate comprising a trench lateral epitaxial overgrowth structure including a trench cavity, wherein the trench cavity includes a growth-blocking layer or patterned material supportive of a coalescent Pendeo layer thereon, on at least a portion of an inside surface of the trench. Such substrate is suitable for carrying out lateral epitaxial overgrowth to form a bridged lateral overgrowth formation overlying the trench cavity. The bridged lateral overgrowth formation provides a substrate surface on which epitaxial layers can be grown in the fabrication of microelectronic devices such as laser diodes, high electron mobility transistors, ultraviolet light emitting diodes, and other devices in which low dislocation density is critical. The epitaxial substrate structures of the invention can be formed without the necessity for deep trenches, such as are required in conventional Pendeo epitaxial overgrowth structures.

34 Claims, 8 Drawing Sheets

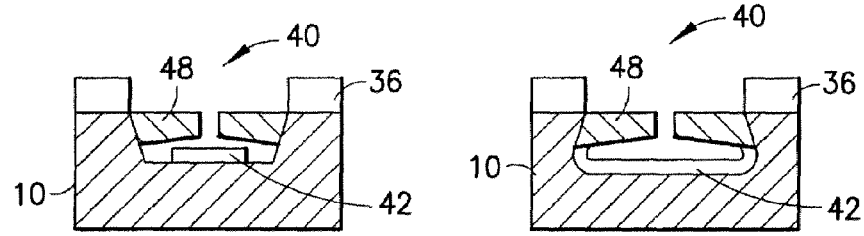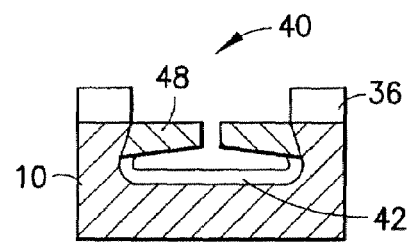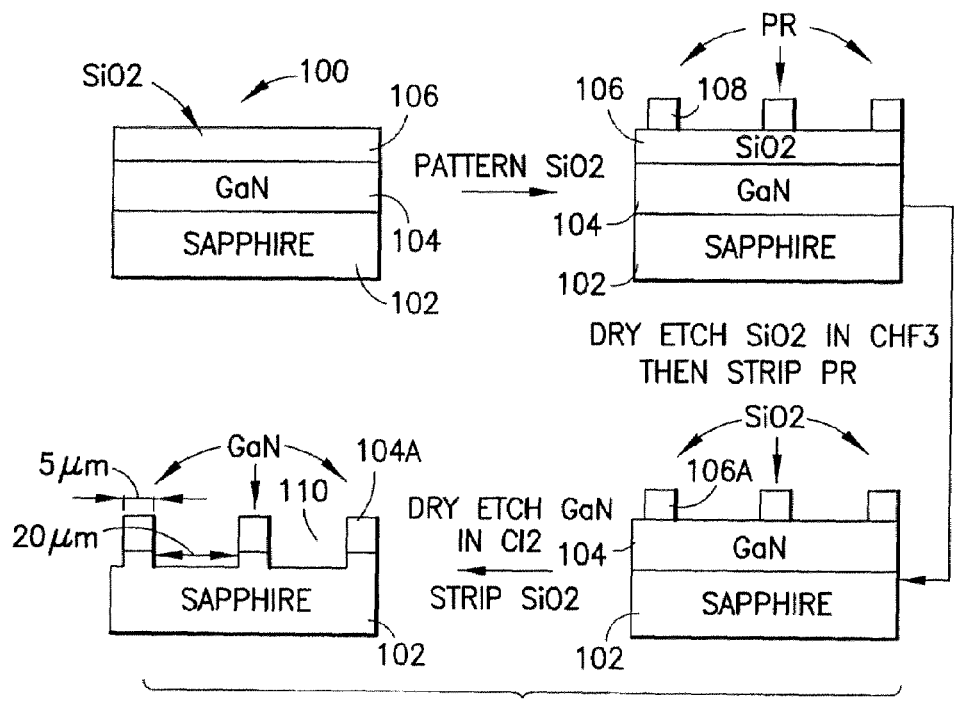

PENDEO EPITAXIAL STRUCTURES AND DEVICES

FIELD OF THE INVENTION

The present invention relates to Pendeo epitaxial growth and to microelectronic devices including Pendeo epitaxial films, such as laser diodes, high electron mobility transistors (HEMTs), ultraviolet light emitting diodes, and other devices in which low dislocation density is critical.

DESCRIPTION OF THE RELATED ART

Lateral epitaxy overgrowth (LEO) is a known technique to reduce dislocations in epitaxial thin films, leading to improved performance and reliability. Pendeo epitaxy is a specialized form of lateral epitaxy overgrowth. Traditional lateral epitaxial overgrowth techniques require a period of vertical growth followed by horizontal growth. Pendeo growth utilizes an etched trench, thereby eliminating the need for an initial vertical growth step. The resulting simplification in the growth cycle produces fewer defective films, shorter growth periods and better uniformity of the product films.

Trench lateral epitaxial overgrowth (LEO) is a preferred technique due to its enablement of the better alignment (registry) with the underlying substrate, and reduced susceptibility to problems such as excessive wing tilt, poor coalescence, etc.

Unfortunately, when Pendeo epitaxial techniques are applied to gallium nitride (GaN) on heteroepitaxial substrates, the etching of the trench must extend downwardly into the heteroepitaxial substrate and the growth temperature must be very high in order to reduce parasitic growth in the center of the trench. Increasing the required etching time, particularly when the substrate is a sapphire substrate or a substrate of similar material, and limiting the available temperature to accommodate such substrate, as required for the use of Pendeo epitaxial techniques, poses problems.

Even if a GaN homoepitaxial substrate is employed for the Pendeo epitaxial growth process, these problems remain. If the etched trench is not sufficiently deep, parasitic growth can damage the lateral layer and the range of process conditions that are available for lateral growth is greatly reduced in scope, so that vertical growth in the window region cannot occur. A general rule of thumb for Pendeo epitaxial growth is that the etched region should be as deep as it is wide.

In consequence of these circumstances, the art continues to seek improvements in Pendeo epitaxial growth processes and resulting films, particularly those involving the use of GaN and other Group III-V materials.

SUMMARY OF THE INVENTION

The present invention relates to substrates useful for forming low dislocation density microelectronic devices and device precursor structures, as well as to microelectronic devices comprising such substrates, and to methods for fabricating such substrates and microelectronic devices.

In one aspect, the invention relates to a substrate comprising a trench lateral epitaxial overgrowth structure including a trench cavity, wherein the trench cavity includes a patterned material supportive of a coalescent Pendeo layer thereon, wherein said patterned material is on at least a portion of an inside surface of said trench.

In another aspect, the invention relates to a microelectronic device comprising such a substrate.

A further aspect of the invention relates to a method of making a microelectronic device structure, comprising:
depositing an oxide layer on a substrate;
depositing a photoresist layer on the oxide layer;
patterning, exposing and developing the photoresist layer, and etching the oxide layer, to expose a surface of the substrate;
etching the exposed surface of the substrate to form a trench cavity therein; and
depositing a patterned material supportive of a coalescent Pendeo layer thereon, on at least a portion of an inside surface of the trench cavity.

In a further aspect, the invention relates to a method of forming a trench lateral epitaxial overgrowth substrate on a base member, comprising:
depositing an oxide layer on the base member;
depositing a photoresist layer on the oxide layer;
patterning, exposing and developing the photoresist layer, and etching the oxide layer, to expose a surface of the base member;
etching the exposed surface of the base member to form a trench cavity therein;
depositing a patterned material supportive of a coalescent Pendeo layer thereon, on at least a portion of an inside surface of the trench cavity; and
growing lateral epitaxial growth projections from side surfaces of the trench cavity toward and into contact with one another to form a bridged lateral overgrowth formation overlying the trench cavity above the patterned material on the inside surface of the trench cavity.

The invention relates in another aspect to a trench cavity structure adapted for lateral epitaxial overgrowth, comprising a trench cavity having floor and sidewall internal surfaces, and a growth-blocking material deposited on floor and internal sidewall internal surfaces of said trench cavity.

A further aspect of the invention relates to a substrate including such trench cavity structure and a lateral epitaxial overgrowth of GaN overlying such trench cavity.

A further aspect the invention relates to a method of making a microelectronic device assembly, comprising:
forming a first coalesced Pendeo layer of GaN on a heteroepitaxial substrate;
growing a layer of GaN on the coalesced Pendeo layer, by MOCVD;
growing a layer of GaN on the MOCVD layer of GaN, by HVPE;
forming a second coalesced Pendeo layer of GaN, on the HVPE layer of GaN;
growing a layer of GaN on the second coalesced Pendeo layer of GaN, by MOCVD; and
forming a microelectronic device structure on and/or in the MOCVD layer of GaN on the second coalesced Pendeo layer of GaN In another aspect, the invention relates to a microelectronic device assembly, comprising:
a first Pendeo layer of GaN;
a first MOCVD layer of GaN on the first Pendeo layer of GaN;
an HVPE layer of GaN on the first MOCVD layer of GaN;
a second Pendeo layer of GaN on the HVPE layer of GaN;
a second MOCVD layer of GaN on the second Pendeo layer of GaN; and
a microelectronic device structure on and/or in the second MOCVD layer of GaN.

A still further aspect of the invention relates to a microelectronic device assembly, comprising:
a sapphire substrate;

GaN pedestals on said sapphire substrate, defining a trench cavity, wherein the sapphire substrate constitutes a floor portion of the trench cavity, and includes convex shoulders adjacent to the GaN pedestals; and a growth-blocking layer on said convex shoulders, whereby said growth-blocking layer suppresses vertical and angular growth from said convex shoulders, to accommodate lateral epitaxial overgrowth across the trench cavity above said convex shoulders.

As used herein, the term "patterned material supportive of a coalescent Pendeo layer thereon" refers to a patterned material which when present on an inside surface of a trench cavity functions to generate Pendeo lateral epitaxial overgrowth on such inside surface that is coalescent with progressive growth, as the lateral growth fronts from pattern elements of the patterned material coalesce to form a Pendeo epitaxial layer over the trench cavity inside surface on which the patterned material has been provided.

Other aspects, features and embodiments of the invention will be more fully apparent from the ensuing disclosure and appended claims.

BRIEF DESCRIPTION OF THE DRAWINGS

FIGS. 7-16 illustrate a process flow for a fabrication of a bridged LEO structure.

FIG. 17 is a schematic representation of a trench cavity structure, featuring a growth-blocking layer on the floor and sidewall portions of the interior surface of the cavity.

FIG. 18 depicts the process flow of a fabrication method for making a trench cavity structure featuring pillars of GaN as base structures for subsequent lateral epitaxial growth.

DETAILED DESCRIPTION OF THE INVENTION, AND PREFERRED EMBODIMENTS THEREOF

The present invention relates to Pendeo epitaxial growth with a blocking layer in the trench, to produce Pendeo epitaxial films characterized by low defect density.

In various embodiments, the invention provides substrates that comprise a trench lateral epitaxial overgrowth structure including a bridged lateral overgrowth formation overlying a trench cavity, in which the trench cavity includes a cavity floor having a vertical growth-blocking layer thereon. Such bridged lateral overgrowth formation provides a substrate surface on which epitaxial layers can be grown in the fabrication of microelectronic devices, e.g., laser diodes, high electron mobility transistors, ultraviolet light emitting diodes, and other devices in which low dislocation density is critical.

As mentioned in the Background of the Invention section hereof, trench lateral epitaxial overgrowth is a preferred technique, but suffers a problem that it is very difficult to create a trench that is deep enough so that the vertical growth in the (damaged) center of the trench does not impede lateral growth. A conventional approach that attempts to resolve this problem utilizes trenches that have a significant depth, but the problem is that such deep trenches typically have very rough bottom surfaces that produce poly-growth formations in the trench. Further, etching trenches of sufficient depth may require a large amount of time, increasing the cost of the wafer, and may lead to degradation of the masked region, causing problems with feature definition.

An ideal trench LEO structure would be characterized by a suitably low bulk substrate defect density, e.g., a defect density not exceeding about $10^7$ defects cm$^{-2}$. A trench of suitable width would be formed in such substrate and submitted to lateral overgrowth, to provide "wings" extending laterally inwardly from the side wall surface at each side of the trench and contacting one another over the void volume of the trough. Such wings desirably would have a defect density not exceeding about $5\times10^5$ defects cm$^{-2}$.

Figure 1:
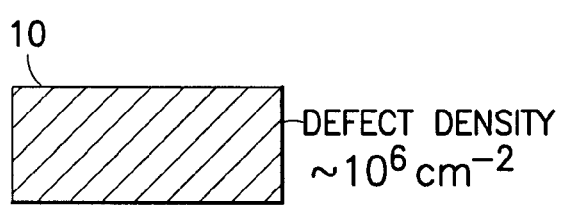
FIGS. 1-3 illustrate a process flow for a fabrication of an idealized trench lateral epitaxial overgrowth structure.
Figure 2:
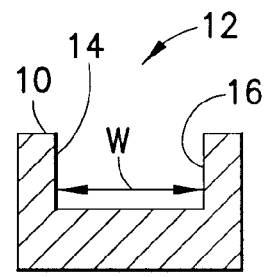
Figure 3:
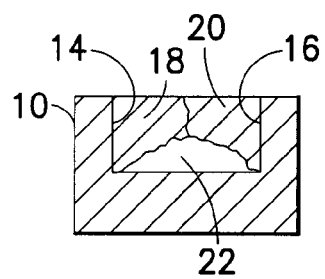

The fabrication of such a trench structure is shown in FIGS. 1-3, in which the substrate 10 is specified in the FIG. 1 as having a defect density of approximately $10^6$ cm$^{-2}$.

FIG. 2 shows the substrate 10 as having been processed to etch a trench 12 therein. Such trench may as illustrated have a width W extending between the sidewalls 14 and 16. The width W of the trench 10 for example be greater than 15 μm, e.g., in a range of from 20-60 μm.

FIG. 3 shows such substrate 10 as having been submitted to lateral overgrowth conditions, to generate interiorly directed growth portions 18 and 20, sometimes referred to in the art as "wings," extending from the trench sidewall surfaces 14 and 16, respectively. The wings, as shown in FIG. 3, at their lateral inward extremities are in contact with one another, i.e., the respective growth portions 18 and 20 have bridged with one another. Such bridged lateral epitaxial growth portions overlie the trench cavity 22.

The ideal trench LEO structure shown in FIG. 3 includes wings that are characterized by a defect density that does not exceed $5 \times 10^5$ defects $cm^{-2}$.

In actual practice, the ideal trench LEO structure shown in FIG. 3 cannot be achieved unless the trench in the substrate is very deep. The reason for this is that trench formations invariably include rough floor surfaces on which the surface asperities act as nucleation growth sites to produce a "mounded" growth mass on the trench floor.

Figure 4:
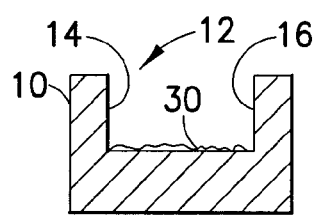
FIGS. 4-6 illustrate a process flow for an attempted fabrication of a bridged LEO structure, as frustrated by the "mounded" growth produced by floor roughness in the relatively shallow trench.
Figure 5:
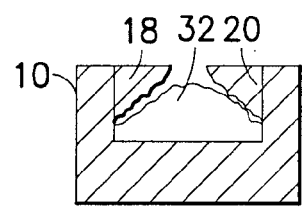
Figure 6:
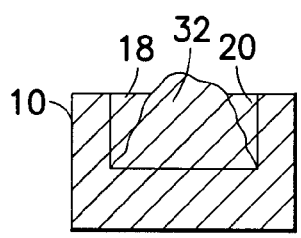

Such deviation from non-ideality is illustrated in the shown in the process flow of FIGS. 4-6, utilizing a relatively moderate depth trench 12 in substrate 10. As illustrated in FIG. 4, the trench 12 is bounded by rough floor 30 and generally vertical sidewalls 14 and 16. Under lateral epitaxial growth conditions, as shown in FIG. 5, the interiorly directed growth portions 18 and 20 growth inwardly toward one other.

At the same time, the undesired growth mass 32 deriving from the rough floor 30 of the trench grows competitively into the void volume of the trench cavity, and ultimately reaches a size that is interposed between growth portions 18 and 20 and prevents their bridging, as shown in FIG. 6. As a result, the device structure shown in FIG. 6 is deficient for its intended purpose as a microelectronic device structure.

Such deficiency is overcome by the provision of a blocking layer in the trench. This shown in the process flow of FIGS. 7-16.

Figure 7:
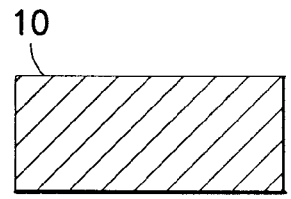
Figure 8:
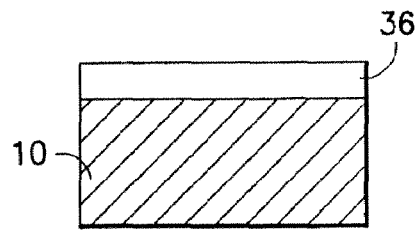
Figure 9:
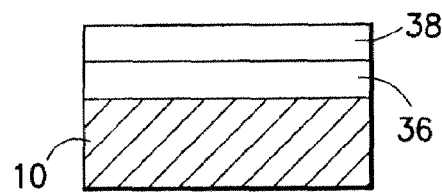
Figure 10:
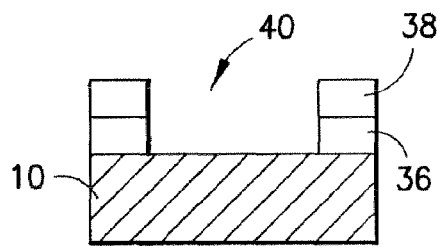

FIG. 7 shows the substrate 10 in an initial form. On this substrate is grown a layer 36 of silicon dioxide ($SiO_2$), as shown in FIG. 8. A photoresist layer 38 then is formed on the silicon dioxide layer 36, as shown in FIG. 9. After patterning, exposure, and development of the photoresist layer 38, and etching of the silicon dioxide layer 36, a trench 40 is formed on the substrate 10, as shown in FIG. 10. The layer 36 may alternatively be formed using any material that is suitable for purposes of masking for purposes of defining the trench region. For example, a 1000 Angstrom thick nickel film may be used.

Figure 11:
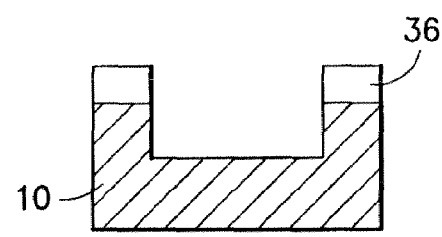

The photoresist remaining in layer 38 then is removed, and the substrate is etched to yield the structure shown in FIG. 11. In this etching, the trench formed in the substrate need not be very deep, in contrast to the prior art process in which an aspect ratio of height to width must be $\geq 1$ in the formation of the trench, in order to avoid interference with the lateral epitaxial growth. The trench formed in the substrate therefore may be relatively shallow, e.g., with a depth on the order of 2 μm, and more generally with a depth of from about 1 μm to about 5 μm, defining a trench structure in the substrate having an aspect ratio of height to width that is <1.

Figure 12:
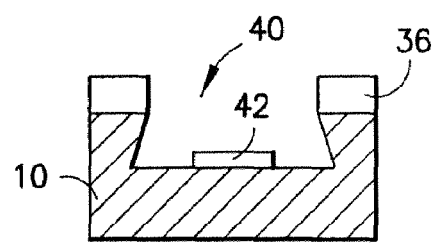

In practice, a slight undercut of the substrate is desirable, with the trench being finished with a low-power reactive ion etch/inductively coupled plasma (RIE/ICP) process to reduce damage in the trench and form the trench cavity conformation as shown in FIG. 12.

FIG. 12 shows the subsequent steps of depositing an oxide layer 42 on the floor of the trench 40. The deposited silicon dioxide forms the oxide layer 42 as well as increases the thickness of the silicon dioxide layer 36. The silicon dioxide layer 36 may then be removed, if desired, or it may remain in place, as shown in the subsequent figures of the process flow. No additional patterning is required to form the trench oxide layer 42 if the trench 40 has a suitable undercut.

Figure 13:
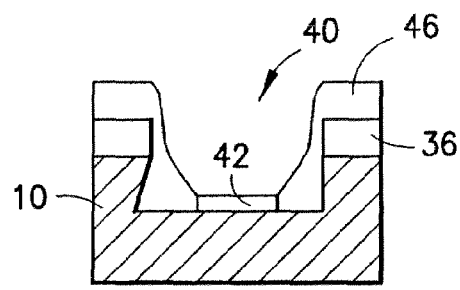

FIG. 13 shows the structure after a layer of photoresist 46 has been deposited to coat the sidewalls of the trench as well as overcoating the silicon dioxide layer 36 in the embodiment shown. Silicon dioxide then may be deposited to build the thickness of the silicon dioxide layer 42, following which the sidewalls are cleaned with a wet/dry etch to remove residue from such sidewalls to accommodate the subsequent lateral epitaxial growth shown in FIG. 14.

Figure 14:
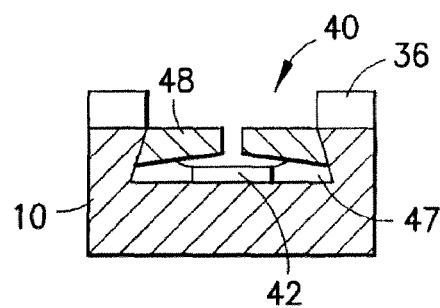

In the FIG. 14 step, there may be residual material 47 at the edges of the trench, as illustrated, but the silicon dioxide layer 42 on the floor the trench prevents vertical growth of the type shown in FIG. 6 and permits the inwardly directed lateral growth projections 48 to grow toward and contact one another and achieve a bridge structure of the type shown in FIG. 3 above the silicon dioxide layer 42.

Figure 15:
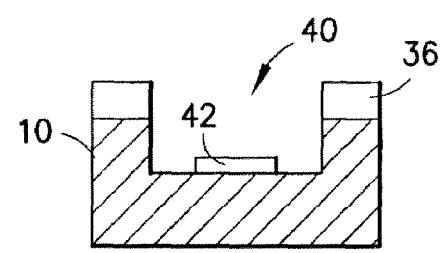

Alternatively, all of the residual material 47 may be removed from the sidewalls and floor of the trench, to yield the structure shown in FIG. 15. Subsequent provision of lateral epitaxial growth conditions then results in the inwardly directed lateral growth projections 48 growing toward one another as shown in FIG. 16, with the lateral growth projections 48 eventually contacting to form the bridge structure of the type shown in FIG. 3.

As an alternative to the deposition of the growth-blocking layer on the floor of the trench cavity, as shown in FIGS. 12-16, the growth-blocking layer may be deposited on the floor as well as sidewall portions of the trench cavity, as shown in FIG. 17. In FIG. 17, the various structural features are numbered correspondingly to the same or similar features in FIGS. 12-16, and the growth-blocking layer is shown as forming a continuous layer over the floor and lower sidewall portions of the inside wall surface of the trench cavity, to facilitate lateral epitaxial overgrowth so that the projections 48 form the bridge structure as illustrated.

It will be recognized that the foregoing steps of the process flow shown in FIGS. 7-17 can be carried out with use of conventional oxide deposition precursors, photoresists and etchants, within the skill the art, based on the disclosure herein.

It will also be appreciated that the growth-blocking layer can be applied to the inside surface of the trench cavity, to any desired extent that is effective for enabling the lateral epitaxial overgrowth to yield a suitable bridge structure. Thus, the growth-blocking layer is deposited on at least a portion of inside surface of the trench cavity, and may for example be formed on the floor and/or sidewalls, as appropriate to achieve the desired bridge structure.

In another aspect of the present invention, GaN Pendeo epitaxy is employed to reduce dislocations in the epitaxial film and to improve device performance, e.g., by reducing threshold currents and improving power and reliability in laser diode applications, by improving internal efficiency of light emitting diodes and laser diodes, and by reducing gate leakage in HEMTs and leakage current in photodetectors. More specifically, such aspect of the invention involves etching of the substrate for Pendeo growth to eliminate parasitic nucleation and to substantially reduce threading dislocation density.

In such Pendeo epitaxy method, a GaN film is grown on a substrate, e.g., a sapphire substrate, by a metalorganic chemical vapor deposition (MOCVD) technique using appropriate precursors and process conditions for such growth. Although described specifically in reference to a sapphire substrate in the ensuing discussion, the substrate could alternatively be an SiC, Si or AlN substrate. The resulting GaN/sapphire material then is processed to form GaN pillars and trenches etched all the way to the sapphire substrate and to a depth in the sapphire material that preferably is more than 2000 Å, in order to prevent nucleation in the trenches from occurring during subsequent regrowth.

The processing scheme is described with reference to FIG. 18. In such scheme, dry etching of the etch mask, and subsequently the GaN pillars, is critical to maintain smooth sidewalls necessary for high-quality overgrowth. It is preferred to define the pattern using a step or instead of a contact aligner, in order to achieve a smoother sidewall and higher uniformity across the wafer.

Referring now to FIG. 18, the initial structure 100 for carrying out the process is shown in the upper left-hand portion of such drawing, as comprising a sapphire substrate 102, on which has been deposited a GaN layer 104, over which has been deposited a layer of $SiO_2$ 106. The layer of $SiO_2$ can be formed for example by plasma enhanced chemical vapor deposition (PECVD) at a suitable thickness, e.g., 2-3 μm.

The initial structure 100 next is subjected to patterning of the $SiO_2$ layer 106, with the photoresist (PR) mask elements 108 being shown on the $SiO_2$ layer in the upper right-hand portion of FIG. 18. Next, the masked $SiO_2$ is subjected to dry etching in trifluoromethane or tetrafluoromethane, followed by stripping of the photoresist, to yield the structure shown in the lower right-hand portion of FIG. 18. Such a structure comprises pillars 106A on the GaN layer 104.

The GaN layer 104 then is dry etched in chlorine or silicon tetrachloride to form GaN pillars 104A of mesa conformation on the sapphire substrate 102, in which the sapphire preferably is etched to a depth of at least 2000 Å. The pillars 104A as shown in the lower left-hand portion of FIG. 18 thereby define cavities 110 between successive pillars 104A, and such cavities may have a lateral dimension on the order of 20 μm, in a specific implementation of the method.

The GaN pillared sapphire substrate article then is reintroduced to the MOCVD system and growth is initiated so that GaN grows from the GaN pillars and not from the sapphire trenches. A low-pressure MOCVD system has been found to yield the best uniformity and highest growth rates in such regrowth processing. The regrowth may be carried out at any suitable temperature, but preferably is conducted at high temperatures in the vicinity of 1050° C., to prevent GaN from nucleated and on the sapphire. In this regrowth step, the GaN will grow vertically on the GaN pillar as well as laterally outwardly. The GaN above the GaN pillar will have threading dislocations with the same dislocation density as the underlying GaN film but the lateral grown region will not propagate such threading dislocations, thereby achieving dislocation density reductions of significant character, e.g., reductions by a factor of $10^2$ to $10^4$.

The lateral growth then results in the two growing wings over the sapphire trench coming into contact and coalescing with one another. The most preferred morphology is produced by a rectangular cross-sectioned pair of wings with perfectly vertical sidewalls in register with one another coalescing to form a bridge structure with little defect generation and high uniformity in relation to one another.

Figure 19:
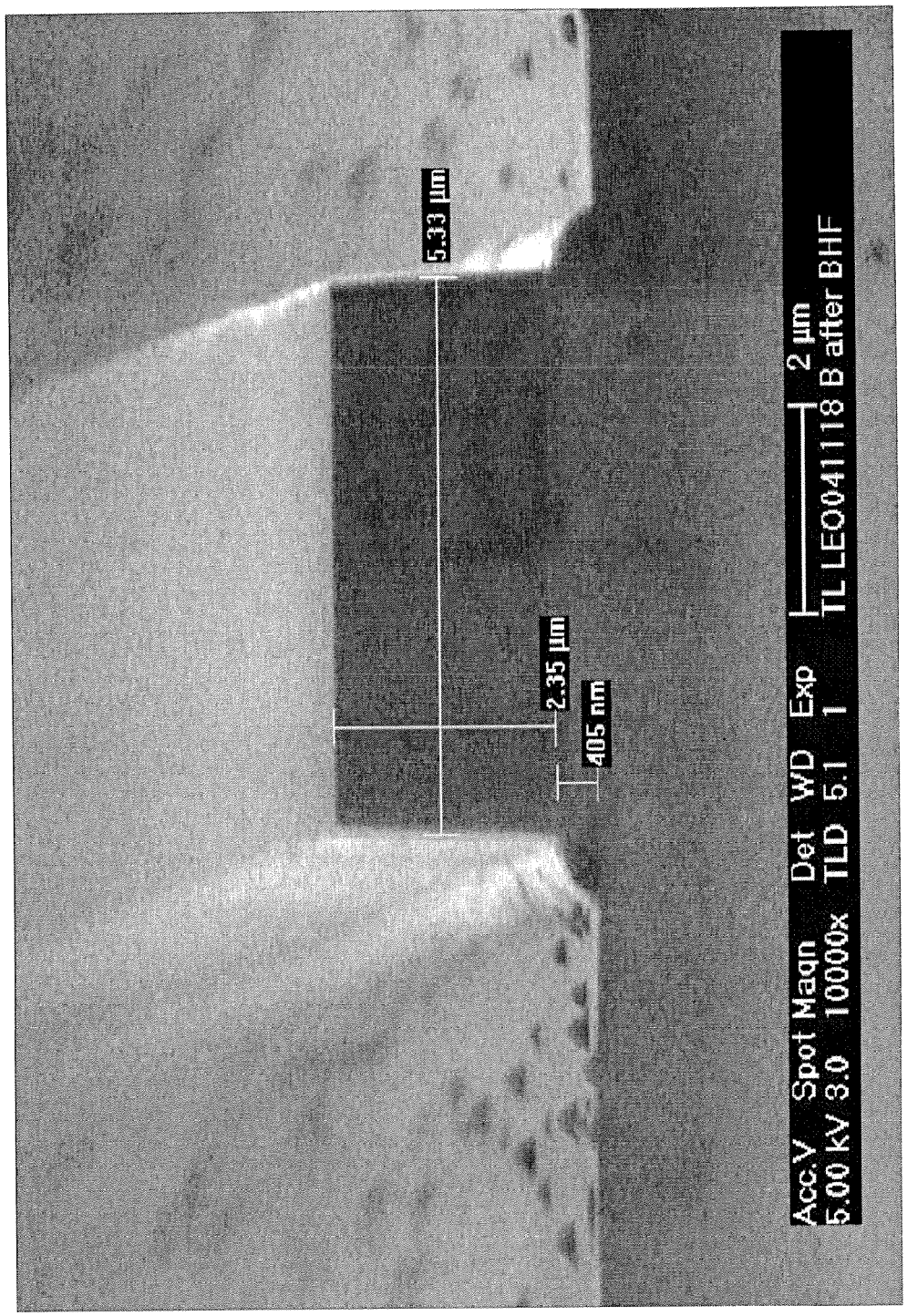
FIG. 19 is a scanning electron micrograph (SEM) of a processed Pendeo wafer ready for regrowth processing.

FIG. 19 is a scanning electron micrograph (SEM) of a processed Pendeo wafer ready for regrowth processing.

Figure 20:
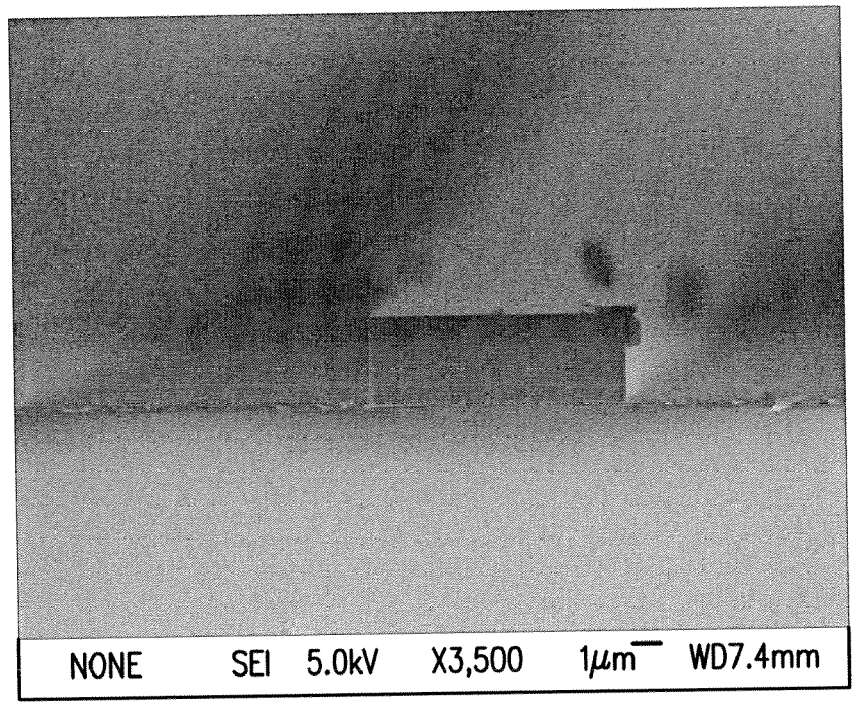
FIG. 20 is an SEM cross-section of a GaN Pendeo strip before coalescence, in which the Pendeo strip exhibits a rectangular cross-section.

FIG. 20 is an SEM cross-section of a GaN Pendeo strip before coalescence, in which the Pendeo strip exhibits a rectangular cross-section.

Figure 21:
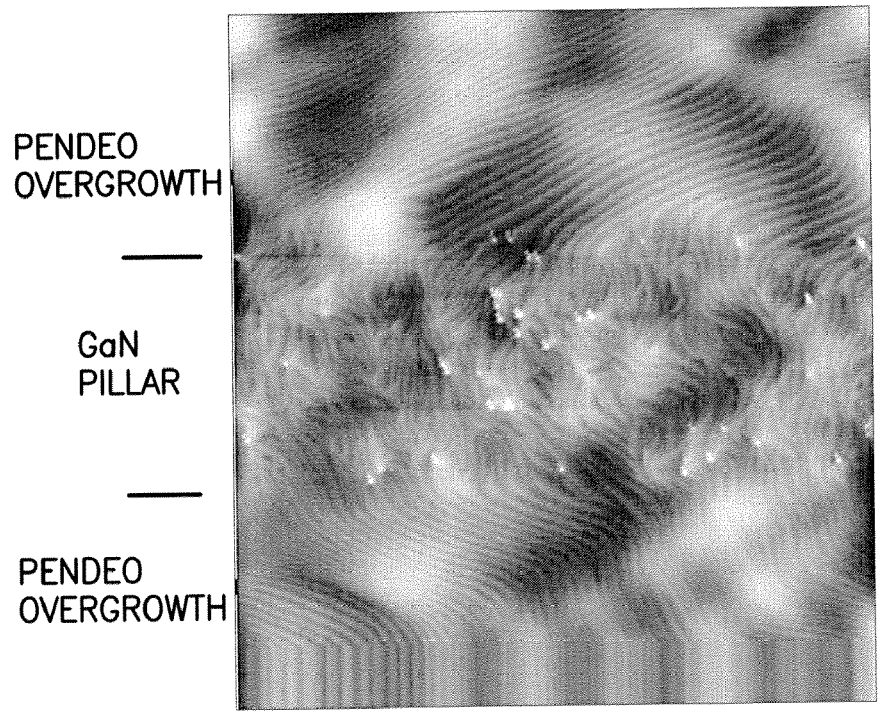
FIG. 21 is an atomic force microscope (AFM) image (15× 15 μm$^2$ scan) of a high dislocation GaN pillar exhibiting step pinning resulting from threading dislocations, and a low dislocation density Pendeo GaN characterized by an absence of step pinning.

FIG. 21 is an atomic force microscope (AFM) image (15× 15 μm$^2$ scan) of the high dislocation GaN pillar exhibiting step pinning resulting from threading dislocations, and low dislocation density Pendeo GaN characterized by an absence of step pinning.

Figure 22:
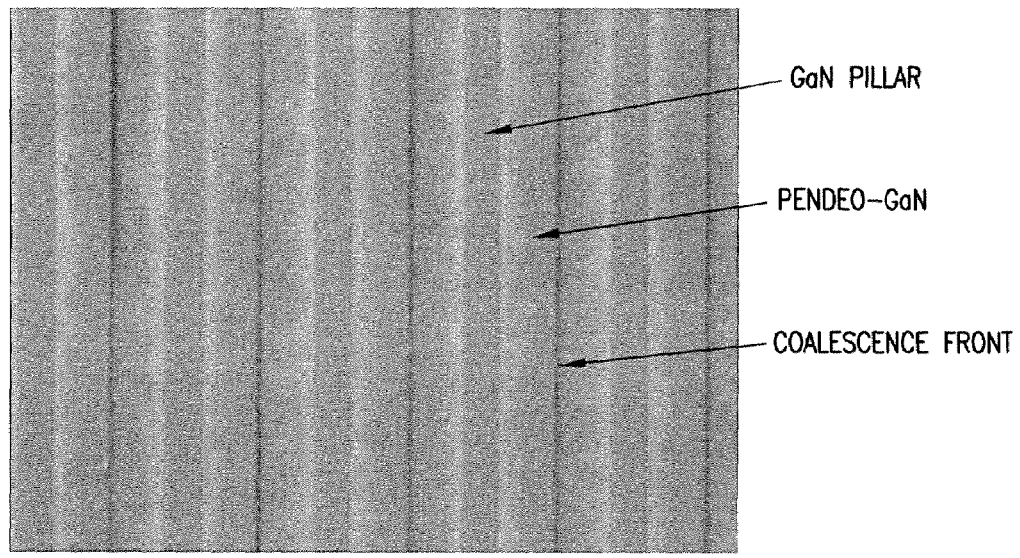
FIG. 22 is an optical microscope image of a Pendeo GaN and GaN pillar structure, showing a coalescence front of the growing stripes just before coalescence of the converging Pendeo GaN stripes takes place.

FIG. 22 is an optical microscope image of a Pendeo GaN and GaN pillar structure, showing a coalescence front of the growing stripes just before coalescence of the converging Pendeo GaN stripes takes place.

Figure 23:
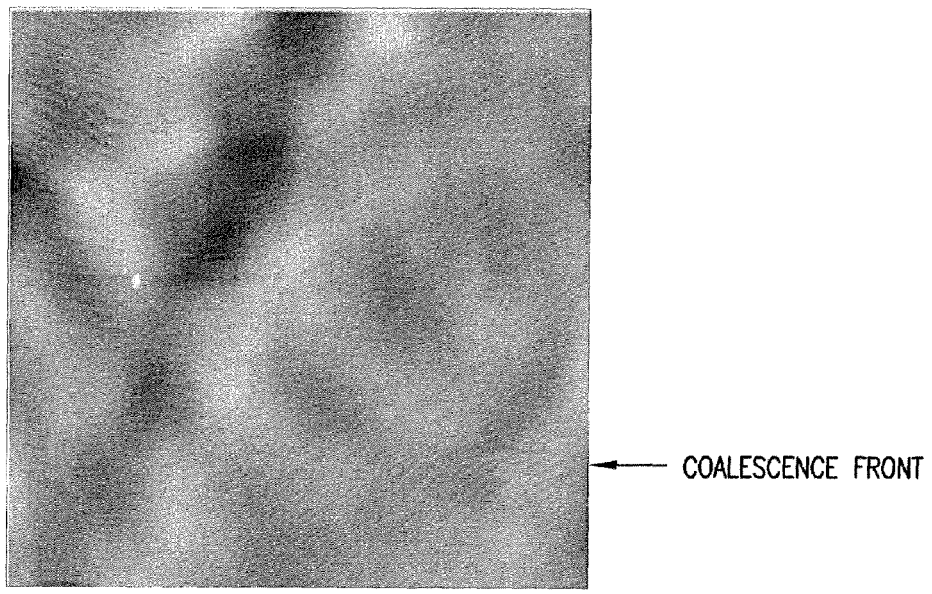
FIG. 23 is an atomic force microscope (AFM) image (15× 15 μm$^2$ scan) of the laterally-grown GaN exhibiting step-flow morphology and an absence of step pinning from threading dislocations.

FIG. 23 is an atomic force microscope (AFM) image (15× 15 μm$^2$ scan) of the laterally-grown GaN exhibiting step-flow morphology and an absence of step pinning from threading dislocations. The only evidence of dislocations in the scan is at the coalescence front where the two growing stripes meet one another.

Once the GaN/sapphire structure is coalesced by MOCVD growth of the convergent stripes, a suitable thickness of GaN, e.g., 10-20 μm, is grown to reduce the dislocations by annihilation from growth. Such a dislocation defect annihilation then produces a wafer structure that is suitable for device fabrication, such as a laser diode. The low dislocation density enables a reliable 405 nm GAN-based laser diode to be produced, as well as other devices such as a high internal efficiency, high-power LED, for a low gate leakage, reliable HEMT.

Figure 24:
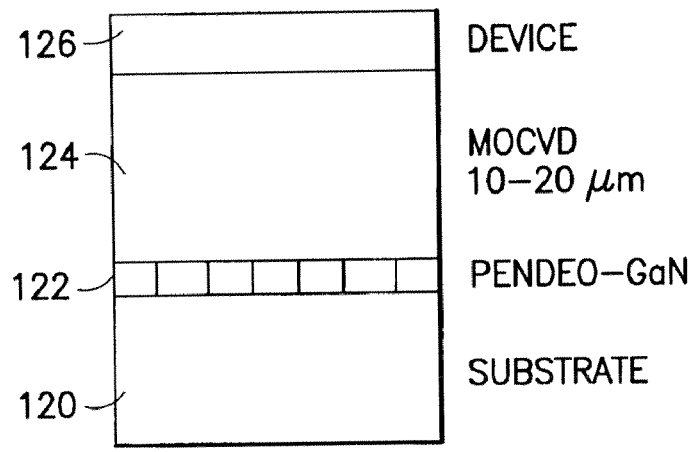
FIG. 24 is a schematic representation of a device structure on the Pendeo wafer comprising a sapphire substrate, a Pendeo GaN layer, an MOCVD GaN layer and a device layer.

FIG. 24 is a schematic representation of a device structure on the Pendeo wafer comprising the sapphire substrate 120, the Pendeo GaN layer 122, the MOCVD GaN layer 124 (shown as having a thickness of 10-20 μm) and a device layer 126.

Figure 25:
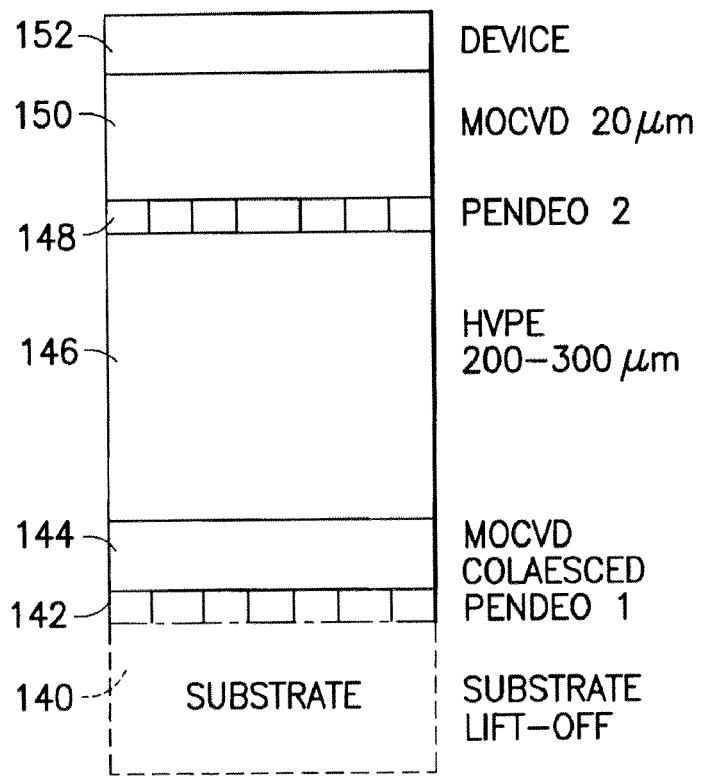
FIG. 25 is a schematic representation of a device structure for a higher power device involving even lower dislocation density, in relation to the device structure of FIG. 24.

FIG. 25 is a schematic representation of a device structure for a higher power device involving even lower dislocation density, in relation to the device structure of FIG. 24. To fabricate such device, Pendeo epitaxy is carried out by MOCVD, and coalescence of the wafer structure is conducted as previously described. After coalescence, a 200-300 μm thickness of GaN is grown on the wafer by HVPE to yield a thick GaN substrate. The sapphire substrate then is removed by suitable lift-off technique, to yield a bulk GaN film.

At this point, a second Pendeo step is performed on the HVPE-generated GaN substrate. The second Pendeo epitaxy step can be carried out in either of two ways. In a first method, deep trenches are etched into the GaN as in the initial Pendeo epitaxial growth process. The pitch of the stripes in this case is produced, to allow overgrowth without interference from GaN growing in the trenches. The pitch can be any suitable value, e.g., 5/5 μm, 10/10 μm or 5/10 μm for the pillar (high dislocation region) and trench (low dislocation region), respectively. In a second method, $SiO_2$ stripes on the GaN film are used as a mask for lateral overgrowth.

In either method, the GaN coalesces and results in low dislocation regions being formed. After coalescence, a device structure is grown by MOCVD, with the critical region of the device, such as the ridge stripe of the laser diode, being placed on the low dislocation region. The double Pendeo epitaxy and bulk GaN substrate enable reliable, high output power 405 nm GaN-based laser diodes to be fabricated.

Referring now to FIG. 25, the lift-off substrate 140 is shown in dashed line outline, and may comprise sapphire, SiC, AlN or other suitable material of construction. Overlying such substrate is the first Pendeo GaN layer 142 and MOCVD GaN layer 144. A thick HVPE layer 146 overlies the GaN layer 144. The second Pendeo epitaxy layer 148, formed by either the etched trench or $SiO_2$ masking stripes alternative techniques described above, overlies the HVPE layer. The HVPE layer may have a thickness of for example 200-300 μm. Overlying the second Pendeo epitaxy layer 148 is a MOCVD-formed layer of GaN, which may for example have a thickness of 20 μm. A device layer 152 overlies the MOCVD GaN layer.

As shown by the foregoing, trench lateral epitaxial overgrowth can be carried out in a simple and efficient manner to avoid the need for the deep trenches otherwise required to avoid interference from vertical trench growth with the lateral growth. As a result, the trench LEO substrate structures are usefully employed to achieve very low defect density levels, e.g., below $5 \times 10^5$ defects $cm^{-2}$, as appropriate for manufacture of microelectronic devices such as laser diodes, HEMTs, UV LEDs, and other devices in which low dislocation density is critical. The trench LEO substrates can readily be formed with GaN overgrowth material, to provide GaN base structures on which GaN can be epitaxially deposited, or on which heteroepitaxial films can be formed. Alternatively, other III-V nitride materials may be employed, including aluminum nitride, aluminum gallium nitride, aluminum indium gallium nitride, indium nitride, aluminum indium nitride, etc.

Any suitable growth conditions useful for forming the trench LEO substrate structure may be employed. Suitable temperature, pressure, composition, flow rate, etc. conditions can be readily empirically determined, without undue experimentation, based on the disclosure herein.

A specific illustrative example is set out below, which is not to be construed as in any way limiting the scope of the invention.

EXAMPLE 1

Pendeo Epitaxy with 15 Micron Wide Reduced Defect Density Stripes Formed on GaN Substrate A free-standing, two-inch diameter GaN substrate with reduced dislocation density in the striped region may be made using the following illustrative process. To safely obtain the best results, a proper processing environment such as found in a semiconductor clean room, as well as proper gear for handling and storing the wafer, and proper protective gear, are employed.

A two-inch diameter HVPE GaN substrate (wafer) is obtained and cleaned using an RCA clean. The RCA clean is a standard clean in the semiconductor industry and consists of an organic clean performed with a 5:1:1 $H_2O$: $H_2O_2$: $NH_4OH$ solution at 80 C, an oxide strip performed with a 50:1 $H_2O$: HF solution at room temperature and an ionic clean performed with a 6:1:1 $H_2O$: $H_2O_2$: HCl solution at 80° C. Photoresist is deposited on the cleaned wafer using standard techniques. The wafer is patterned using a contact aligner and a mask that consists of 15 micron wide stripes on 20 micron centers. The photoresist is exposed, etched and cleaned so that 5 micron wide stripes running the length of the wafer are opened in the photoresist. A slight undercut is preferable. A nickel layer is deposited using an evaporator on the patterned photoresist. The wafer is processed so that the metal is lifted off, leaving 5 micron wide nickel stripes on the GaN wafer, separated by 15 micron openings. The stripes are oriented along the $\langle 10\overline{1}0 \rangle$ direction.

An inductively coupled plasma (ICP) etching system flowing a gas mixture of 9:1 $Cl_2$: BCl is used to etch the GaN in the unmasked striped regions. One micron or more of GaN material in the striped opening is removed. Etch conditions are preferably adjusted to obtain a slight undercut.

The wafer is transferred to a silicon dioxide deposition system such as a sputter tool or e-beam evaporator. Approximately 0.1 micron thickness of $SiO_2$ is deposited. The nickel is etched in a solution of 1:1 $HNO_3$:$H_2O$, removing the nickel stripe and any oxide deposited onto the nickel stripe. The wafer surface now consists of 5 micron wide stripes of GaN and 15 micron GaN trenches with an oxide layer deposited on the base of the trench. An oxide etch may be required to remove any silicon dioxide from the trench sidewalls, but the etch time should be chosen so that at least 0.05 microns of oxide remains at the base of the trench. An additional 1:1 HCl:$H_2O$ etch or other cleaning steps may be required to remove residual contaminants from the surface of the GaN.

The wafer is loaded into an MOCVD GaN growth system to grow the Pendeo epitaxy layer over the oxide trench region. The system uses triethylgallium (TEG) and ammonia in hydrogen. The lateral and vertical growth rates of the GaN are heavily dependent on the temperature and TEG/$NH_3$ flow ratio and may require some adjustment to establish appropriate process conditions. Further, it is found that adjustments to the epitaxial growth are preferred to achieve lateral growth layers with reduced strain and good coalescence. For example, the Pendeo epitaxy may be initiated with one hour of growth at T=1100° C. and V/III ratio of about 1300, and then followed by ten hours of growth at T=1020° C. and V/III of 700. The growth time is adjusted once coalescence is reached. Given proper preparation and growth conditions, the fifteen micron wide oxide trench is fully covered with low dislocation density GaN.

Figure 26:
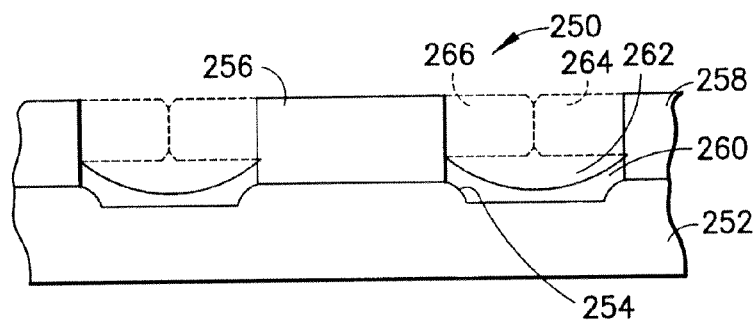
FIG. 26 is a schematic representation of a sapphire substrate having GaN pedestals thereon defining successive trench structures between adjacent pedestals, and utilizing a growth-blocking layer to compensate the convex shoulder portions of the sapphire substrate.

FIG. 26 is a schematic representation of a sapphire substrate having GaN pedestals thereon defining successive trench structures 262 between adjacent pedestals, and utilizing a growth-blocking layer to compensate the convex shoulder portions of the sapphire substrate. The sapphire substrate 252 as illustrated features convex rounded shoulders 254 at the interface between the sapphire substrate and the gallium nitride pedestals 256, 258. Such interfacial shoulders also are shown in the photomicrograph of FIG. 19.

In order to restrict the vertical and angular growth that would propagate from the convex shoulders 254, a layer of a blocking material 260 is applied to the inner surface of the trench 262, overlying such convex shoulders, so that lateral epitaxial overgrowth, involving formation, growth and coalescence of wings 264 and 266, is unimpeded by aberrant growth that would otherwise propagate from the convex shoulders and interfere with the wing formation and coalescence.

As illustrated, the blocking material 260 may be applied to the floor and lower sidewall portions of the inner surface of the trench or such blocking layer may simply be localized over the convex shoulder at each side of the trench. The blocking material may comprise silicon dioxide or other oxide layer material of suitable character to inhibit growth on the surface on which it is deposited.

By the provision of the convex shoulder blocking material overlayer, the structure 250 accommodates efficient lateral epitaxial overgrowth of the trench by wings 264 and 266.

Figure 27:
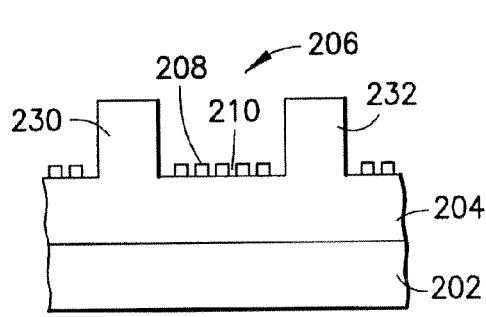
FIG. 27 is a schematic representation of a GaN layer on a base layer, wherein the GaN layer defines trenches, on the floor of which is a patterned material supportive of a coalescent Pendeo layer thereon.

FIG. 27 is a schematic representation of a GaN layer on a base layer, wherein the GaN layer defines trenches, on the floor of which is a patterned material supportive of a coalescent Pendeo layer thereon. The structure shown in FIG. 27 includes a base layer 202, which may be homoepitaxial or heteroepitaxial in character. On the base layer 202 is formed a layer of III-V nitride material, e.g., GaN, that has been processed to form a trench cavity 206 between adjacent pedestals 230 and 232 of the III-V nitride material.

In accordance with one preferred aspect of the invention, the floor of trench 206 is patterned with a patterned material supportive of a coalescent Pendeo layer thereon. As discussed earlier herein, the term "patterned material supportive of a coalescent Pendeo layer thereon" is used herein to mean a patterned material which when present on an inside surface of a trench cavity functions to generate Pendeo lateral epitaxial overgrowth on such inside surface that is coalescent with progressive growth, as the lateral growth fronts from pattern elements of the patterned material coalesce to form a Pendeo epitaxial layer over the trench cavity inside surface on which the patterned material has been provided.

The patterned material may be silicon dioxide or other oxide layer useful for such coalescent Pendeo layer formation in the trench cavity. As shown in FIG. 27, the patterned material is constituted by upwardly extending elements 208 defining intervening spaces 210, as a discontinuous structure on which coalescent Pendeo layer growth can occur, to provide a base layer in the cavity that is non-interfering with the lateral epitaxial overgrowth from the overlying sidewall portions of the trench cavity.

Figure 28:
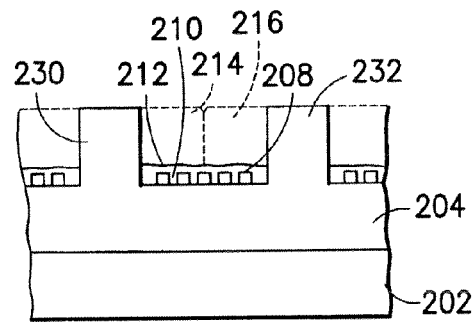
FIG. 28 is a schematic representation of the FIG. 27 structure, following growth of a coalesced Pendeo layer, and illustrating the overlying lateral growth from the trench sidewalls.

FIG. 28 is a schematic representation of the structure of FIG. 27, after coalescent Pendeo layer growth has been carried out on the patterned material on the floor of the trench cavities. As shown, the coalescent Pendeo layer 212 has been grown over the pattern elements 208, to form a base layer of epitaxial overgrowth material that is non-interfering with reference to the lateral epitaxial overgrowth overlying the patterned material, involving wing formation of wings 214 and 216, which grow to and coalesce with one another.

In this manner, a highly effective epitaxial overgrowth of very low defect density, e.g., below $5 \times 10^5$ defects $cm^{-2}$, is achieved.

The patterned material may be formed on the floor of the trench cavities in any suitable manner, such as by deposition of a layer formed of a bicomponent mixture, including fugitive material, e.g., a sublimable material, which is processed to form spaced-apart elements 208 on the inner surface of the cavity. The fugitive material may be removed by processing conditions, e.g., a thermal gradient in the case of sublimable material, by irradiation and volatilization of the fugitive component, or in other suitable manner having regard to the particular fugitive material employed in the bicomponent, or multicomponent mixture.

Alternatively, micro-patterning could be carried out with photoresist to form such small-scale elements within the trench. Still further, nano-machining may be carried out to pattern the material and form elements 208.

The structure shown in FIG. 28 therefore facilitates gross and fine lateral epitaxial overgrowth processes that cooperate to form the respective coalesced overgrowth layers, including a fine overgrowth layer on the patterned elements on the trench inner surface and a gross lateral epitaxial overgrowth from the upper portions of the sidewalls of the trench cavity, above the fine overgrowth layer.

The respective gross and fine overgrowths may be formed sequentially or contemporaneously, with respect to one another, using appropriate process conditions that will be readily determinable by those of ordinary skill in the art based on the disclosure herein.

Figure 29:
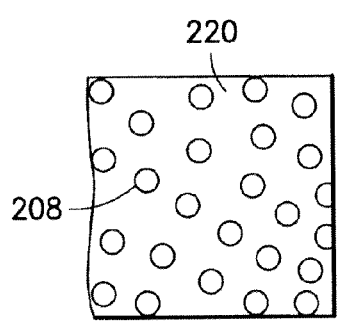
FIG. 29 is a top plan view of the trench floor of FIG. 27, showing a pattern according to a first embodiment.

FIG. 29 is a top plan view of the trench floor of FIG. 27, showing a pattern according to a first embodiment. This patterned material includes a series of laterally spaced-apart pedestals 208 on the floor 220 of the cavity, so that lateral overgrowth progresses radially from each of the pedestals toward adjacent coalescent growth.

Figure 30:
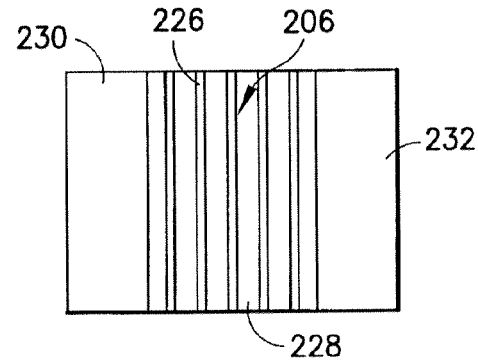
FIG. 30 is a top plan view of the trench floor of the structure of FIG. 27, showing the patterned material according to a second embodiment.

FIG. 30 is a top plan view of the trench floor of the structure of FIG. 27, showing the patterned material according to a second embodiment. In this embodiment, the floor of the trench includes micro-stripes 226 on the floor 228 of the trench cavity bounded by pedestals 230 and 232.

It will be recognized that the patterned material on the inside surface of the trench cavity can be formed and arranged in various suitable ways to provide a coalescent Pendeo layer of growth in a lower portion of the trench cavity that will avoid issues of vertical and angular growth that would otherwise interfere with the lateral epitaxial overgrowth from the sidewalls of the trench cavity.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A substrate comprising a trench structure including a trench cavity, wherein the trench cavity includes a growth-blocking material on less than an entirety of any one surface in said trench cavity.

2. The substrate of claim 1, wherein the material comprises an oxide layer.

3. The substrate of claim 2, wherein the oxide layer comprises silicon dioxide.

4. The substrate of claim 1, wherein the trench cavity has a height to width aspect ratio that is less than 1.

5. The substrate of claim 1, wherein the trench cavity has a width in a range of from 15 to 60 μm.

6. The substrate of claim 1, further comprising a bridged lateral overgrowth formation overlying the trench cavity.

7. The substrate of claim 6, wherein the bridged lateral overgrowth formation has a defect density that is below $5 \times 10^5$ defects cm−2.

8. The substrate of claim 6, wherein the bridged lateral overgrowth formation comprises a III-nitride.

9. The substrate of claim 6, wherein the bridged lateral overgrowth formation comprises GaN.

10. The substrate of claim 1, wherein the trench cavity has a depth in a range of from about 1 μm to about 5 μm.

11. A microelectronic device comprising the substrate of claim 1.

12. A microelectronic device comprising the substrate of claim 6.

13. The microelectronic device of claim 11, as selected from the group consisting of laser diodes, HEMTs, and UV LEDs.

14. A method of making a microelectronic device structure, comprising:
   depositing an oxide layer on a substrate;
   depositing a photoresist layer on the oxide layer;
   patterning, exposing and developing the photoresist layer, and etching the oxide layer, to expose a surface of the substrate;
   etching the exposed surface of the substrate to form a trench cavity therein;
   depositing a patterned material supportive of a coalescent Pendeo layer thereon, on at least a portion of an inside surface of the trench cavity.

15. The method of claim 14, further comprising growing lateral epitaxial growth projections from side surfaces of the trench cavity toward and into contact with one another to form a bridged lateral overgrowth formation overlying the trench cavity above the patterned material.

16. A method of forming a trench lateral epitaxial overgrowth substrate on a base member, comprising:
   depositing an oxide layer on the base member;
   depositing a photoresist layer on the oxide layer;
   patterning, exposing and developing the photoresist layer, and etching the oxide layer, to expose a surface of the base member;

etching the exposed surface of the base member to form a trench cavity therein;

depositing a patterned material supportive of a coalescent Pendeo layer thereon, on at least a portion of an inside surface of the trench cavity; and growing lateral epitaxial growth projections from side surfaces of the trench cavity toward and into contact with one another to form a bridged lateral overgrowth formation overlying the trench cavity above the patterned material.

17. The method of claim 16, wherein said base member is heteroepitaxial.

18. A trench cavity structure adapted for lateral epitaxial overgrowth, comprising a trench cavity having floor and sidewall internal surfaces, and a growth-blocking material deposited on floor and lower sidewall internal surfaces, wherein said growth-blocking material on said lower sidewall surfaces is at a height greater than the thickness of the growth-blocking material deposited on the floor of said trench cavity, with upper sidewall internal surfaces being devoid of said growth-blocking material thereon, so that the growth-blocking material deposited on the floor of the trench cavity prevents vertical growth, and so that the lateral epitaxial overgrowth comprises laterally inwardly directed growth of projections from both upper sidewall internal surfaces of said trench cavity into contact with one another to form a bridge structure.

19. The trench cavity structure of claim 18, wherein the growth-blocking material comprises an oxide layer.

20. The trench cavity structure of claim 18, wherein the growth-blocking layer comprises silicon dioxide.

21. A method of making a microelectronic device assembly, comprising:
forming a first coalesced Pendeo layer of GaN on a heteroepitaxial substrate;
growing a layer of GaN on the coalesced Pendeo layer, by MOCVD;
growing a layer of GaN on the MOCVD layer of GaN, by HVPE;
forming a second coalesced Pendeo layer of GaN, on the HVPE layer of GaN;
growing a layer of GaN on the second coalesced Pendeo layer of GaN, by MOCVD; and
forming a microelectronic device structure on and/or in the MOCVD layer of GaN on the second coalesced Pendeo layer of GaN.

22. The method of claim 21, wherein the second coalesced Pendeo layer of GaN is grown as pitched stripes on said HVPE layer of GaN.

23. The method of claim 21, wherein the second coalesced Pendeo layer of GaN is grown on said HVPE layer of GaN after masking of said HVPE layer with SiO2 stripes.

24. A microelectronic device assembly, comprising:
a first Pendeo layer of GaN;
a first MOCVD layer of GaN on the first Pendeo layer of GaN;
an HVPE layer of GaN on the first MOCVD layer of GaN;
a second Pendeo layer of GaN on the HVPE layer of GaN;
a second MOCVD layer of GaN on the second Pendeo layer of GaN; and
a microelectronic device structure on and/or in the second MOCVD layer of GaN.

25. A microelectronic device assembly, comprising:
a sapphire substrate;
GaN pedestals on said sapphire substrate, defining a trench cavity, wherein the sapphire substrate constitutes a floor portion of the trench cavity, and includes convex shoulders adjacent to the GaN pedestals; and
a growth-blocking layer on said convex shoulders, whereby said growth-blocking layer suppresses vertical and angular growth from said convex shoulders, to accommodate lateral epitaxial overgrowth across the trench cavity above said convex shoulders.

26. A microelectronic device assembly, comprising a trench cavity having floor and sidewall internal surfaces, a growth-blocking material deposited on floor and lower sidewall internal surfaces, wherein said growth-blocking material on said lower sidewall surfaces is at a height greater than the thickness of the growth-blocking material deposited on the floor of said trench cavity, with upper sidewall internal surfaces being devoid of said growth-blocking material thereon, and laterally inwardly extended growth projections that extend from both upper sidewall internal surfaces of said trench cavity and contact with one another at their lateral inward extremeties to form a bridge structure above the floor of the cavity.

27. A microelectronic device assembly, comprising:
a heteroepitaxial substrate;
III-V nitride pedestals on said heteroepitaxial substrate, defining a trench cavity, wherein the substrate constitutes a floor portion of the trench cavity, and includes convex shoulders adjacent to the pedestals; and
a growth-blocking layer on said convex shoulders, whereby said growth-blocking layer suppresses vertical and angular growth from said convex shoulders, to accommodate lateral epitaxial overgrowth across the trench cavity above said convex shoulders.

28. The microelectronic device assembly of claim 27, wherein the heteroepitaxial substrate comprises a material selected from among sapphire, SiC, Si and AlN.

29. The substrate of claim 1, wherein the growth-blocking material includes spaced-apart elements on said surface.

30. The substrate of claim 1, wherein said trench cavity comprises a first sidewall, a second sidewall and a floor.

31. The substrate of claim 30, wherein said any one surface comprises surface of said floor.

32. The substrate of claim 30, wherein said any one surface comprises a sidewall surface.

33. The substrate of claim 30, wherein said growth-blocking material is on less than an entirety of surfaces of each of the first and second sidewalls.

34. The substrate of claim 30, wherein said growth-blocking material is on less than an entirety of surfaces of each of the first and second sidewalls and said floor.

* * * * *